(12) United States Patent
Nakatani et al.

(10) Patent No.: US 10,911,003 B2
(45) Date of Patent: Feb. 2, 2021

(54) DOHERTY AMPLIFIER

(71) Applicant: Mitsubishi Electric Corporation, Tokyo (JP)

(72) Inventors: Keigo Nakatani, Tokyo (JP); Shintaro Shinjo, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/473,194

(22) PCT Filed: Jan. 24, 2017

(86) PCT No.: PCT/JP2017/002279
§ 371 (c)(1),
(2) Date: Jun. 24, 2019

(87) PCT Pub. No.: WO2018/138763
PCT Pub. Date: Aug. 2, 2018

(65) Prior Publication Data
US 2020/0091871 A1    Mar. 19, 2020

(51) Int. Cl.
*H03F 3/68* (2006.01)
*H03F 1/02* (2006.01)
*H03F 3/21* (2006.01)

(52) U.S. Cl.
CPC ........... *H03F 1/0288* (2013.01); *H03F 3/211* (2013.01); *H03F 2200/387* (2013.01);
(Continued)

(58) Field of Classification Search
CPC ................................ H03F 1/0288; H03F 3/68
(Continued)

(56) References Cited

U.S. PATENT DOCUMENTS

| | | |
|---|---|---|
| 5,568,086 A | 10/1996 | Schuss et al. |
| 7,427,895 B1 | 9/2008 | Okubo et al. |

(Continued)

FOREIGN PATENT DOCUMENTS

| | | |
|---|---|---|
| JP | 8-330873 A | 12/1996 |
| JP | 2004-304766 A | 10/2004 |

(Continued)

OTHER PUBLICATIONS

Doherty, "A New High-Efficiency Power Amplifier for Modulated Waves," Proceedings of the Institute of Radio Engineers, vol. 24, No. 9, 1936, pp. 1163-1182.

(Continued)

*Primary Examiner* — Steven J Mottola
(74) *Attorney, Agent, or Firm* — Birch, Stewart, Kolasch & Birch, LLP

(57) ABSTRACT

A Doherty amplifier includes a carrier amplifier, a peaking amplifier, and a phase compensation circuit. The carrier amplifier 11 includes a main amplifying element and a parasitic element, and the peaking amplifier includes an auxiliary amplifying element and a parasitic element. The phase compensation circuit has a negative electrical length that allows a total electrical length of a signal transmission path starting from an output source of the main amplifying element to a power combiner to become 180°×N−90° where N is a positive integer. In addition, a signal transmission path starting from an output source of the auxiliary amplifying element to the power combiner has an electrical length of 180°×M−180° where M is a positive integer.

9 Claims, 6 Drawing Sheets

(52) U.S. Cl.
CPC ............... *H03F 2200/451* (2013.01); *H03F 2203/21106* (2013.01); *H03F 2203/21139* (2013.01); *H03F 2203/21142* (2013.01)

(58) Field of Classification Search
USPC ............................................. 330/124 R, 295
See application file for complete search history.

(56) References Cited

U.S. PATENT DOCUMENTS

| | | |
|---|---|---|
| 2004/0233008 A1 | 11/2004 | Kobayashi |
| 2010/0052779 A1 | 3/2010 | Shin et al. |
| 2011/0279178 A1* | 11/2011 | Outaleb ............... H03F 1/56 330/124 R |
| 2018/0254749 A1* | 9/2018 | Grebennikov ......... H03F 3/602 |

FOREIGN PATENT DOCUMENTS

| | | |
|---|---|---|
| JP | 2006-332829 A | 12/2006 |
| JP | 2007-43305 A | 2/2007 |
| JP | 2007-116259 A | 5/2007 |
| JP | 2008-516515 A | 5/2008 |
| WO | WO 2006/041234 A1 | 4/2006 |

OTHER PUBLICATIONS

International Search Report (PCT/ISA/210) issued in PCT/JP2017/002279, dated Apr. 18, 2017.

\* cited by examiner

DOHERTY AMPLIFIER

TECHNICAL FIELD

The present invention relates to a Doherty amplifier for amplifying power of a high-frequency signal such as a microwave.

BACKGROUND ART

Amplifying elements such as field-effect transistors (FETs) exhibit good power efficiency but are degraded in the linearity of input/output characteristics during a large signal operation in which the amplifying elements operate around a saturated region, and exhibit good linearity of input/output characteristics but are degraded in power efficiency during a small signal operation. A power amplifier called Doherty amplifier devised by W. H. Doherty in 1936 is known as a technology for solving such problems (refer to Non-patent Literature 1). In recent years, in radio communication systems for mobile communication, satellite communication, or the like, high linearity of input/output characteristics (low distortion characteristics) and high power efficiency of power amplifiers are required. Various types of Doherty amplifiers have been researched and developed to meet these kinds of requirements.

For example, a Doherty amplifier disclosed in Patent Literature 1 (Japanese patent application publication No. 2006-332829) includes a divider for dividing an input signal into two signals, a carrier amplifier for amplifying power of one of the two signals, a first transmission line connected to an output end of the carrier amplifier, a phase regulator for delaying the phase of the other of the two signals by 90 degrees (quarter wavelength), a peaking amplifier for amplifying power output from the phase regulator, a second transmission line connected to an output end of the peaking amplifier, and a combining terminal for combining an output of the first transmission line and an output of the second transmission line with each other. In such a Doherty amplifier, the carrier amplifier includes an amplifying element (FET) biased for an AB-class operation, and the peaking amplifier includes an amplifying element (FET) biased for a B-class operation or C-class operation.

CITATION LIST

Patent Literature

Patent Literature 1: Japanese Patent Application Publication No. 2006-332829 (for example, see FIG. 1 and paragraphs [0020] and [0021]).

Non-Patent Literature

Non-patent Literature 1: W. H. Doherty, "A New High-Efficiency Power Amplifier for Modulated Waves," Proceedings of the Institute of Radio Engineers, Vol. 24, No. 9, pp. 1163-1182, 1936.

SUMMARY OF INVENTION

Technical Problem

In the conventional Doherty amplifier described above, however, the peaking amplifier may have a parasitic element connected to the output stage of the amplifying element of the peaking amplifier, and the carrier amplifier may also have a parasitic element connected to the output stage of the amplifying element of the carrier amplifier. Such parasitic elements change the output phases of the respective amplifying elements, and make longer the electrical length from the respective amplifying elements to the combining terminal, which causes the problem in that the pass characteristics of the conventional Doherty amplifier become narrower in bandwidth, making amplification of power of wideband signals difficult.

In view of the above, an object of the present invention is to provide a Doherty amplifier capable of amplifying power of wideband signals with high efficiency even when a carrier amplifier or a peaking amplifier has a parasitic element.

Solution to Problem

According to an aspect of the present invention, there is provided a Doherty amplifier includes: a carrier amplifier including a main amplifying element configured to amplify power of a first input signal and including a parasitic element connected to an output source of the main amplifying element; a first phase compensation circuit configured to adjust a phase of an output signal of the carrier amplifier; a peaking amplifier including an auxiliary amplifying element configured to amplify power of a second input signal and including a parasitic element connected to an output source of the auxiliary amplifying element; a second phase compensation circuit configured to adjust a phase of an output signal of the peaking amplifier; and a power combiner configured to combine an output of the first phase compensation circuit with an output of the second phase compensation circuit. The first phase compensation circuit has a negative electrical length that allows an electrical length of a signal transmission path starting from the output source of the main amplifying element to the power combiner to become 180°×N−90° where N is a positive integer. A signal transmission path starting from the output source of the auxiliary amplifying element to the power combiner has an electrical length of 180°×M−180° where M is a positive integer.

Advantageous Effects of Invention

According to the present invention, the power of wideband signals can be amplified with high efficiency even when the carrier amplifier or peaking amplifier has a parasitic element.

DESCRIPTION OF EMBODIMENTS

Figure 1:
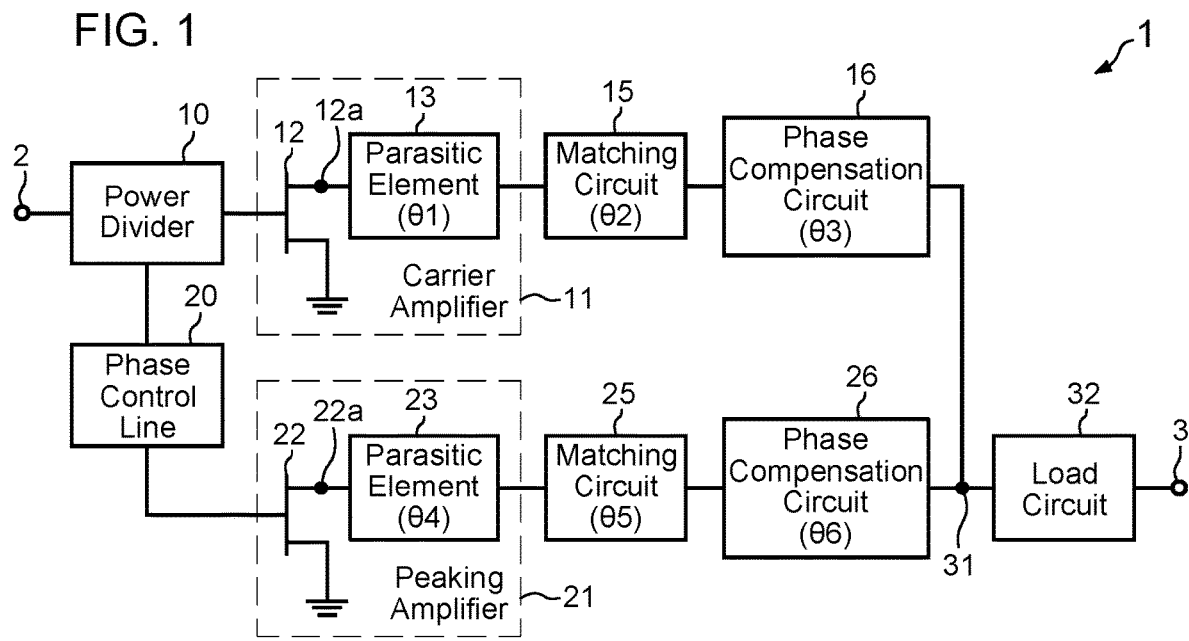
FIG. 1 is a diagram schematically illustrating a configuration of a Doherty amplifier according to a first embodiment of the present invention.

Various embodiments of the present invention will be described in detail below with reference to the drawings. In all the drawings, components represented by the same reference numeral are assumed to have the same configuration and the same function.

First Embodiment

FIG. 1 is a diagram schematically illustrating a configuration of a Doherty amplifier 1 according to a first embodiment of the present invention. The Doherty amplifier 1 includes: an input terminal 2; a power divider 10 for dividing a high-frequency signal input to the input terminal 2, into two input signals; a carrier amplifier 11 for amplifying power of one input signal (first input signal) output from the power divider 10; a matching circuit (first matching circuit) 15 connected to an output end of the carrier amplifier 11; a phase compensation circuit (first phase compensation circuit) 16 for adjusting the phase of a signal transferred from the output end of the carrier amplifier 11 via the matching circuit 15; a power combiner 31 connected to an output end of the phase compensation circuit 16; a load circuit 32; and an output terminal 3. The matching circuit 15 is a circuit that is located between the output end of the carrier amplifier 11 and an input end of the phase compensation circuit 16 and performs impedance matching.

The carrier amplifier 11 includes a main amplifying element 12, and a parasitic element 13 connected to an output source 12a that is a current source of the main amplifying element 12. As the main amplifying element 12, a semiconductor element having an amplification function such as a silicon lateral double diffused MOS (Si-LDMOS), field effect transistor (FET), high electron mobility transistor (HEMT), or hetero junction bipolar transistor (HBT) may be used.

The parasitic element 13 of the carrier amplifier 11 has a positive electrical length $\theta 1$ that changes the phase of a signal output from the main amplifying element 12. An example of the parasitic element 13 includes an element, a wire, and a package material such as ceramics or resin, which has a parasitic capacitance ($C_{ds}$) to be added to the main amplifying element 12. In a case where the main amplifying element 12 is protected by a package, a wire connecting the output source 12a such as a drain terminal of the main amplifying element 12 with an external terminal outside of the package can be the parasitic element 13 having an electrical length that changes the phase of the output signal.

As illustrated in FIG. 1, the Doherty amplifier 1 also includes a phase control line 20 for delaying the phase of the other input signal (second input signal) output from the power divider 10 by 90° corresponding to a quarter wavelength, a peaking amplifier 21 for amplifying the power of a signal output from the phase control line 20, a matching circuit (second matching circuit) 25 connected to an output end of the peaking amplifier 21, and a phase compensation circuit (second phase compensation circuit) 26 for adjusting the phase of a signal input from an output end of the peaking amplifier 21 via the matching circuit 25. The matching circuit 25 is a circuit that is located between the output end of the peaking amplifier 21 and an input end of the phase compensation circuit 26 and performs impedance matching.

The peaking amplifier 21 includes an auxiliary amplifying element 22, and a parasitic element 23 connected to an output source 22a that is a current source of the auxiliary amplifying element 22. As the auxiliary amplifying element 22, the same type of semiconductor element as that for the main amplifying element 12 may be used. The parasitic element 23 of the peaking amplifier 21 has a positive electrical length $\theta 4$ that changes the phase of a signal output from the auxiliary amplifying element 22. An example of the parasitic element 23 includes an element, a wire, and a package material (such as ceramics or resin), which has a parasitic capacitance to be added to the auxiliary amplifying element 22. In a case where the auxiliary amplifying element 22 is protected by a package, a wire connecting the output source 22a such as a drain terminal of the auxiliary amplifying element 22 with an external terminal outside of the package can be the parasitic element 23 having an electrical length that changes the phase of the output signal.

The power combiner 31 combines an output of the phase compensation circuit 16 and an output of the phase compensation circuit 26 with each other, and outputs an composite output to the load circuit 32. The power combiner 31 can be comprised of a known directional coupler, for example. The load circuit 32 is an impedance conversion circuit for taking the composite output and passing the composite output to the output terminal 3.

Note that, while an input end of main amplifying element 12 is connected directly to an output end of the power divider 10 in the present embodiment, no limitation thereto is intended. Depending on the input impedance of the main amplifying element 12 and the phase condition of a signal transmission path starting from the output source 12a to the power combiner 31, an appropriate circuit may be connected between the power divider 10 and the carrier amplifier 11. In addition, while an input end of the auxiliary amplifying element 22 is connected directly to an output end of the phase control line 20, no limitation thereto is intended. Depending on the input impedance of the auxiliary amplifying element 22 and the phase condition of a signal transmission path starting from the output source 22a to the power combiner 31, an appropriate circuit may be connected between the phase control line 20 and the peaking amplifier 21.

Each of the matching circuits 15 and 25 and the phase compensation circuits 16 and 26 may be comprised of either a lumped constant circuit including elements such as a chip capacitor, or a distributed constant circuit element such as a line pattern. In the present embodiment, the matching circuits 15 and 25 have positive electrical lengths $\theta 2$ and $\theta 5$, respectively. In contrast, the phase compensation circuits 16 and 26 have negative electrical lengths $\theta 3$ and $\theta 6$, respectively.

Figure 2A:
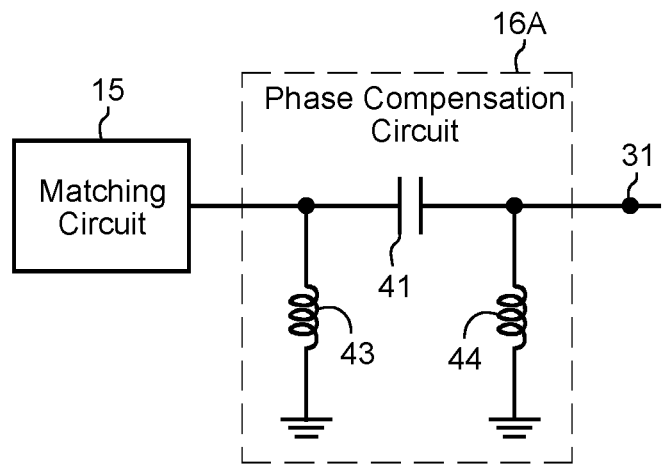
FIGS. 2A to 2C are diagrams schematically illustrating example configurations of a phase compensation circuit provided on a carrier amplifier side in the first embodiment.
Figure 2B:
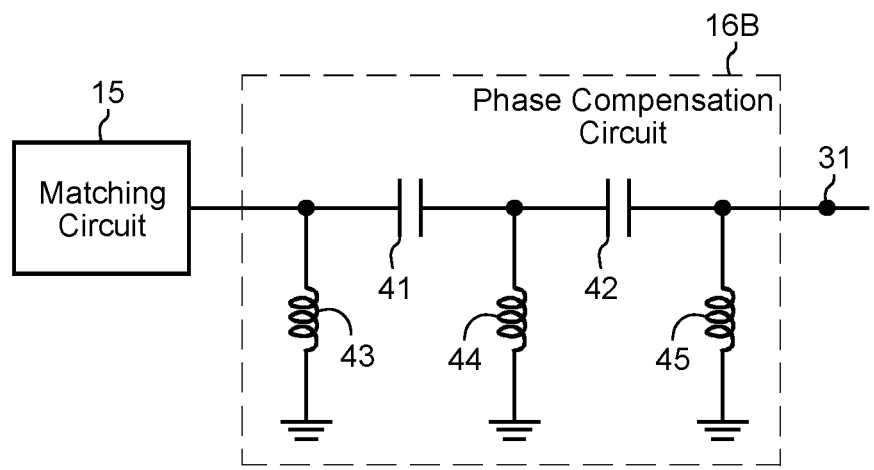
Figure 2C:
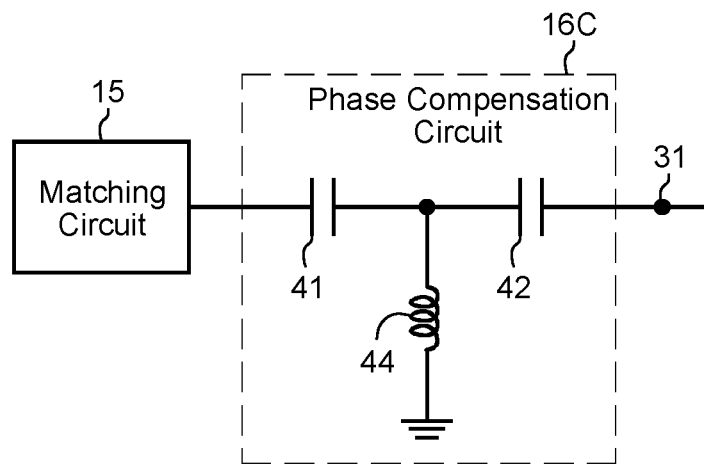

FIGS. 2A to 2C are diagrams illustrating phase compensation circuits 16A, 16B, and 16C, which are example configurations of the phase compensation circuit 16 provided on the carrier amplifier 11 side. These phase compensation circuits 16A, 16B, and 16C are configured as phase advancers for advancing the phase of an input signal. The phase compensation circuit 16A as illustrated in FIG. 2A is a π-type circuit with an L-C-L configuration including a capacitive element 41 and inductor elements 43 and 44. One end of the capacitive element 41 is connected to an output end of the matching circuit 15 and one end of the inductor element 43. The other end of the capacitive element 41 is connected to the power combiner 31 and one end of the inductor element 44. In addition, the other ends of the inductor elements 43 and 44 are grounded. Individual adjustment of the capacitance of the capacitive element 41 and the inductances of the inductor elements 43 and 44 enables adjustment of the electrical length θ3 of the phase compensation circuit 16A.

The phase compensation circuit 16B as illustrated in FIG. 2B is a phase advancer comprised of capacitive elements 41 and 42 and inductor elements 43, 44, and 45. In the phase compensation circuit 16B, one end of the capacitive element 41 is connected to an output end of the matching circuit 15 and an end of the inductor element 43. The other end of the capacitive element 41 is connected to one end of the inductor element 44. In addition, one end of the capacitive element 42 is connected to one end of the inductor element 44, and the other end of the capacitive element 42 is connected to the power combiner 31 and one end of the inductor element 45. The other ends of the inductor elements 43, 44, and 45 are grounded. Individual adjustment of the capacitances of the capacitive elements 41 and 42 and the inductances of the inductor elements 43, 44, and 45 enables adjustment of the electrical length θ3 of the phase compensation circuit 16B.

In addition, the phase compensation circuit 16C as illustrated in FIG. 2C is a T-type circuit with a C-L-C configuration including capacitive elements 41 and 42 and an inductor element 44. In the phase compensation circuit 16C, one end of the capacitive element 41 is connected to an output end of the matching circuit 15, and the other end of the capacitive element 41 is connected to one end of the inductor element 44 and one end of the capacitive element 42. In addition, the other end of the capacitive element 42 is connected to the power combiner 31. Individual adjustment of the capacitances of the capacitive elements 41 and 44 and the inductance of the inductor element 44 enables adjustment of the electrical length θ3 of the phase compensation circuit 16C.

Figure 3A:
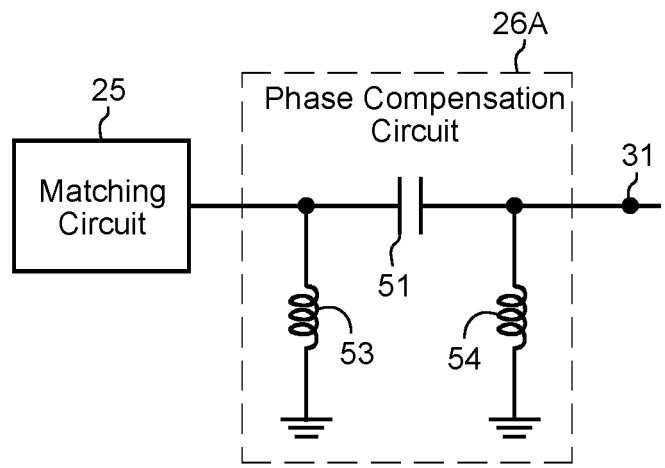
FIGS. 3A to 3C are diagrams schematically illustrating example configurations of a phase compensation circuit provided on a peaking amplifier side in the first embodiment.
Figure 3B:
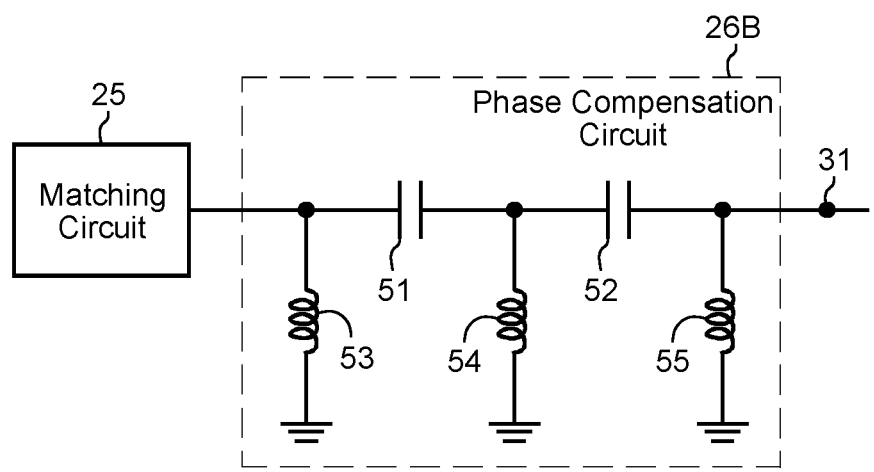
Figure 3C:
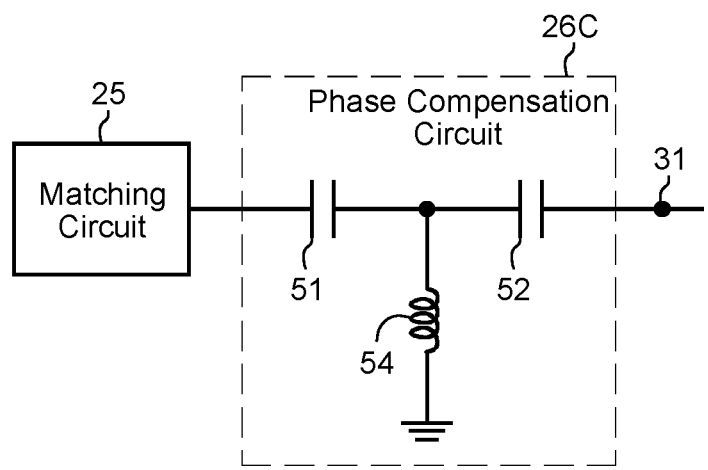

Meanwhile, FIGS. 3A to 3C are diagrams illustrating phase compensation circuits 26A, 26B, and 26C, which are example configurations of the phase compensation circuit 26 provided on the peaking amplifier 21 side. The phase compensation circuit 26A in FIG. 3A is a phase advancer having an L-C-L configuration similar to that of the phase compensation circuit 16A in FIG. 2A, and comprised of a capacitive element 51 and inductor elements 53 and 54. Individual adjustment of the capacitance of the capacitive element 51 and the inductances of the inductor elements 53 and 54 enables adjustment of the electrical length θ6 of the phase compensation circuit 26A. The phase compensation circuit 26B in FIG. 3B is a phase advancer having a configuration similar to that of the phase compensation circuit 16B in FIG. 2B, and comprised of capacitive elements 51 and 52 and inductor elements 53, 54 and 55. Individual adjustment of the capacitances of the capacitive elements 51 and 52 and the inductances of the inductor elements 53, 54, and 55 enables adjustment of the electrical length θ6 of the phase compensation circuit 26B. Furthermore, the phase compensation circuit 26C in FIG. 3C is a phase advancer having a C-L-C configuration similar to that of the phase compensation circuit 16C in FIG. 2C, and comprised of capacitive elements 51 and 52 and an inductor element 54. Individual adjustment of the capacitances of the capacitive elements 51 and 52 and the inductance of the inductor element 54 enables adjustment of the electrical length θ6 of the phase compensation circuit 26C.

In the present embodiment, the phase compensation circuit 16 has a negative electrical length θ3 that allows the total electrical length of a signal transmission path starting from the output source 12a of the main amplifying element 12 to the power combiner 31 to become 180°×N−90° where N is a positive integer. On the other hand, the phase compensation circuit 26 has a negative electrical length θ6 that allows the total electrical length of a signal transmission path starting from the output source 22a of the auxiliary amplifying element 22 to the power combiner 31 to become 180°×M−180° where M is a positive integer.

Next, the principle of an operation of the Doherty amplifier 1 will be explained. The main amplifying element 12 of the carrier amplifier 11 is biased so as to operate as an AB class amplifier or a B class amplifier, and the auxiliary amplifying element 22 of the peaking amplifier 21 is biased so as to operate as a C class amplifier. When a signal input to the input terminal 2 has a low level, the Doherty amplifier 1 performs a back-off operation. In this operation, the main amplifying element 12 amplifies the power of the input signal, while the auxiliary amplifying element 22 is in an off state and does not operate. When the level of a signal input to the input terminal 2 exceeds a certain level, however, the auxiliary amplifying element 22 operates.

When the impedance of the output source 12a of the main amplifying element 12 is $R_{opt}$, the impedance as seen from the output source 12a is $2 \times R_{opt}$ and the impedance at the output source 22a of the auxiliary amplifying element 22 is open during the back-off operation. Thus, during the back-off operation, the Doherty amplifier 1 has only the characteristics of the signal transmission path starting from the carrier amplifier 11 to the power combiner 31. For example, in a case where the signal transmission path including the parasitic element 13, the matching circuit 15, and the phase compensation circuit 16 has an electrical length of 90° and is a line having a characteristic impedance of $R_{opt}$, the characteristic impedance is transformed to an impedance of $R_{opt}/2$ by the power combiner 31. In this manner, fundamental impedance variation of the Doherty amplifier 1 is produced.

For example, assume a case where the electrical length θ1 of the parasitic element 13 is 20°, the electrical length θ4 of the parasitic element 23 is 20°, the electrical length θ2 of the matching circuit 15 is 80°, and the electrical length θ5 of the matching circuit 25 is 80°. In order to satisfy the condition that the total electrical length of the signal transmission path starting from the output source 12a of the main amplifying element 12 to the power combiner 31 is 180°×N−90°, the phase compensation circuit 16 may have a negative electrical length θ3 of −10°, for example. Similarly, in order to satisfy the condition that the total electrical length of the signal transmission path starting from the output source 22a of the auxiliary amplifying element 22 to the power combiner 31 is 180°×M−180°, the phase compensation circuit 26 may have a negative electrical length θ6 of −100°, for example.

Figure 4:
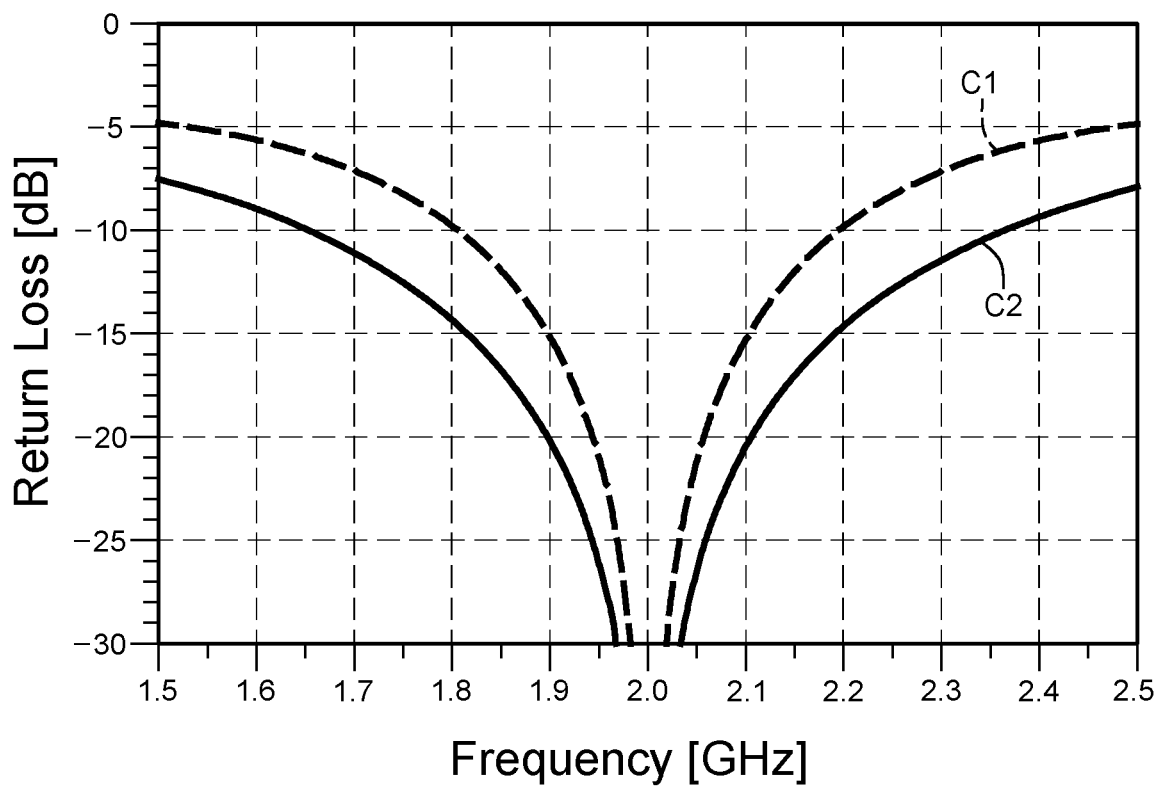
FIG. 4 is a graph illustrating reflection characteristics of a main amplifying element in the first embodiment.

FIG. 4 is a graph illustrating an example of reflection characteristics (frequency characteristics) of the main amplifying element 12 in the Doherty amplifier 1 of the first embodiment. In this graph, the horizontal axis represents frequency (unit: GHz), and the vertical axis represents return loss (reflection loss) (unit: dB). A characteristic curve C2 shown in this graph is a curve obtained under a condition of θ1=20°, θ4=20°, θ2=80°, θ5=80°, θ3=−10°, and θ6=−100°. In contrast, a characteristic curve C1 is a curve obtained with a structure (hereinafter referred to as a "conventional structure") in which a line having a positive electrical length of 170° is used instead of the phase compensation circuit 16 having a negative electrical length in the Doherty amplifier 1 of the present embodiment. As illustrated in FIG. 4, in the conventional structure, the reflection loss tends to be larger as the frequency bandwidth is larger. In contrast, in the structure of the present embodiment, it can be said that the reflection loss is small over a wide band.

Figure 5:
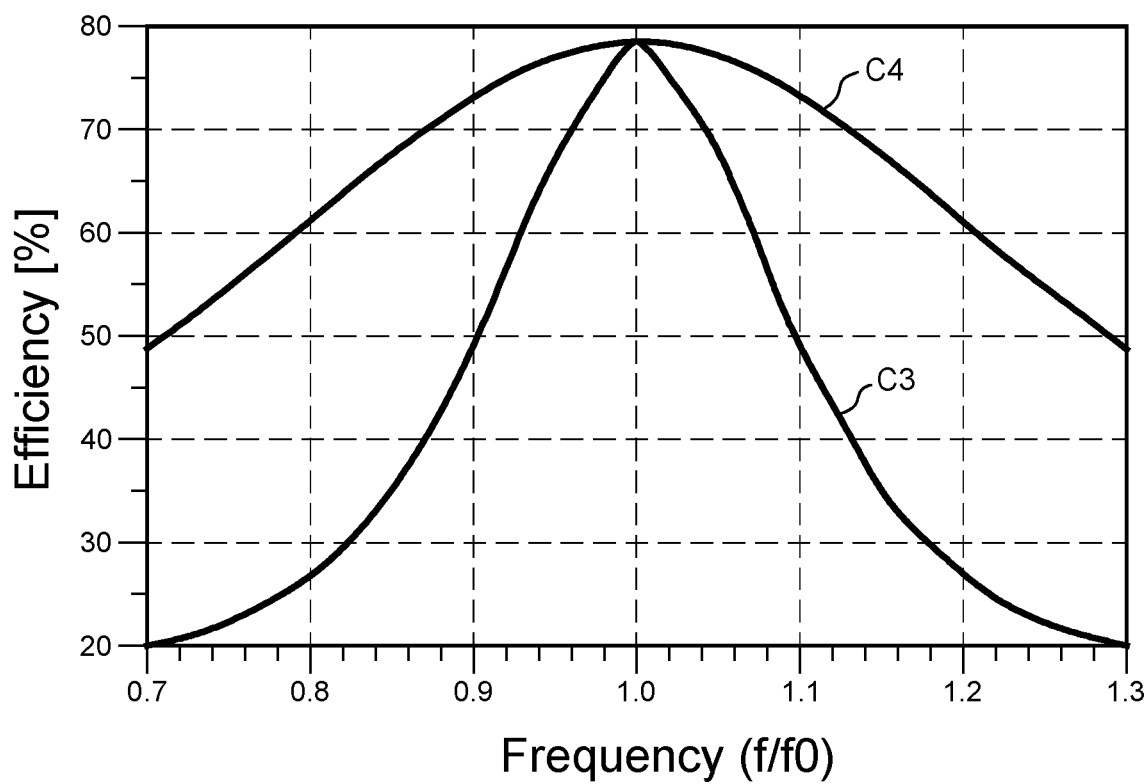
FIG. 5 is a graph illustrating frequency characteristics of power efficiency of the Doherty amplifier in the first embodiment.

FIG. 5 is a graph illustrating frequency characteristics of power efficiency when the output is 6 dB during a back-off operation of the Doherty amplifier 1. In this graph, the horizontal graph represents frequency obtained by normalization with use of the center frequency f0 (=2 GHz), and the vertical axis represents power efficiency (unit: %). The graph is associated with the graph of FIG. 4. A curve C3 is a curve obtained with the aforementioned conventional structure, and a curve C4 is a curve obtained with the structure of the present embodiment. As is clear from the curve C4, with the structure of the present embodiment, the decrease in efficiency in a specific frequency band is small and wideband characteristics are achieved. Note that a similar effect is produced for a back-off amount other than 6 dB.

With reference to FIG. 4, in the conventional structure, since the line having an electrical length of 170° is provided instead of the phase compensation circuit 16 of the present embodiment, the total electrical length of the signal transmission path starting from the output source 12a of the main amplifying element 12 to the power combiner 31 is 270°, and thus the reflection characteristics (characteristic curve C1) are likely to be affected by the frequency, which are narrowband characteristics. In contrast, with the structure of the present embodiment, since the total electrical length of the signal transmission path starting from the output source 12a of the main amplifying element 12 to the power combiner 31 is 90°, which is short, the reflection characteristics (characteristic curve C2) are less likely to be affected by the frequency and signal amplification in wideband is enabled. Thus, the Doherty amplifier 1 of the present embodiment has a structure in which an unnecessary electrical length is shortened and impedance matching over a wideband in a specific frequency band is enabled. The Doherty amplifier 1 of the present embodiment can therefore amplify signals over a wideband in a specific frequency band.

In addition, as illustrated in FIG. 5, in the band characteristics of efficiency during the back-off operation with the structure of the present embodiment, the amount of decrease in the efficiency relative to that at the center frequency f0 is smaller than that with the conventional structure, in a specific frequency range. Thus, the output circuit comprised of the carrier amplifier 11, the matching circuit 15, the phase compensation circuit 16, the peaking amplifier 21, the matching circuit 25, and the phase compensation circuit 26 has low frequency dependence, and can amplify signals over a wide band.

As described above, in the Doherty amplifier 1 of the first embodiment, the phase compensation circuit 16 has a negative electrical length $\theta 3$ that allows the total electrical length of the signal transmission path starting from the output source 12a of the main amplifying element 12 to the power combiner 31 to become 180°×N−90° where N is a positive integer, which makes it possible to shorten the total electrical length of the signal transmission path. In addition, the phase compensation circuit 26 also has a negative electrical length $\theta 6$ that allows the total electrical length of the signal transmission path starting from the output source 22a of the auxiliary amplifying element 22 to the power combiner 31 to become 180°×M−180° where M is a positive integer, which makes it possible to shorten the total electrical length of the signal transmission path. Thus, even in a case where the parasitic element 13 of the carrier amplifier 11 is an unnecessary parasitic element that changes the phase of an amplified output from the main amplifying element 12 or in a case where the parasitic element 23 of the peaking amplifier 21 is an unnecessary parasitic element that changes the phase of an amplified output from the auxiliary amplifying element 22, the Doherty amplifier 1 can amplify power of wideband signals with high efficiency. Furthermore, even in a case where the matching circuit 15 has a configuration that unnecessarily changes the phase of an amplified output from the main amplifying element 12 or in a case where the matching circuit 25 has a configuration that unnecessarily changes the phase of an amplified output from the auxiliary amplifying element 22, the phase compensation circuit 16 or the phase compensation circuit 26 can compensate for the unnecessary phase change, which enables the Doherty amplifier 1 to amplify power of wideband signals with high efficiency.

Note that, while the matching circuits 15 and 25 are provided in the first embodiment, there can be an embodiment in which the matching circuits 15 and 25 are not provided.

Second Embodiment

Figure 6:
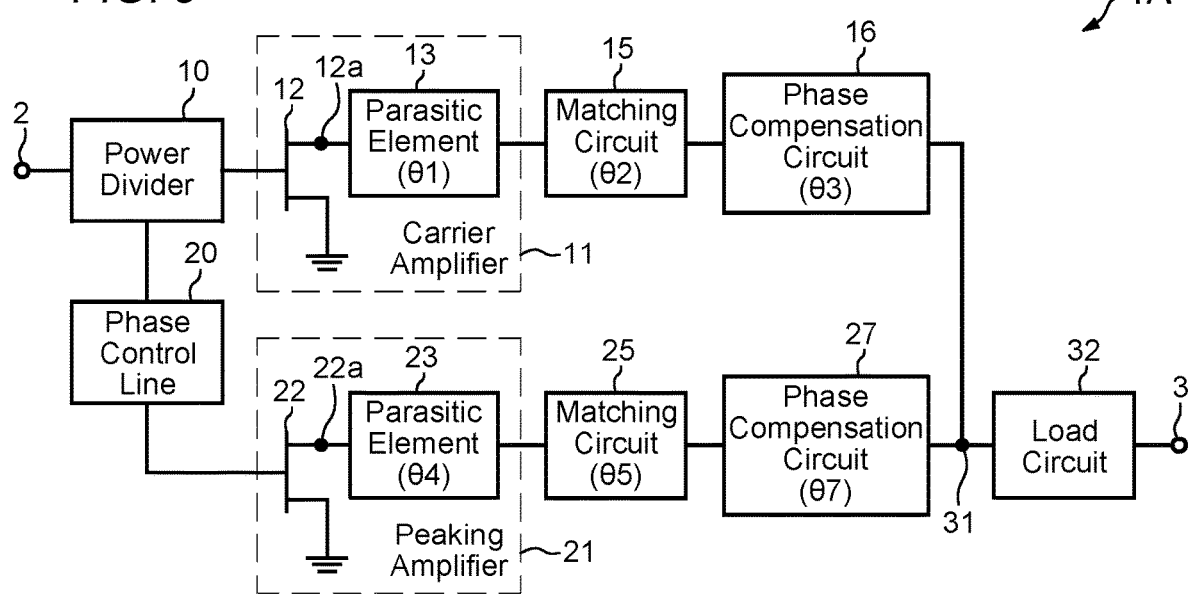
FIG. 6 is a diagram schematically illustrating a configuration of a Doherty amplifier according to a second embodiment of the present invention.

Next, a second embodiment according to the present invention will be described. FIG. 6 is a diagram illustrating a schematic configuration of a Doherty amplifier 1A according to the second embodiment of the present invention. The Doherty amplifier 1A has the same configuration as that of the Doherty amplifier 1 of the first embodiment except that the Doherty amplifier 1A includes a phase compensation circuit 27 having a positive electrical length $\theta 7$ as illustrated in FIG. 6 instead of the phase compensation circuit 26 having the negative electrical length $\theta 6$ as illustrated in FIG. 1. The phase compensation circuit 27 is a circuit located between an output end of the peaking amplifier 21 and an input end of the phase compensation circuit 26 and performs impedance matching.

In the present embodiment, similarly to the case of the first embodiment, the phase compensation circuit 16 has a negative electrical length $\theta 3$ that allows the total electrical length of a signal transmission path starting from the output source 12a of the main amplifying element 12 to the power combiner 31 to become 180°×N−90° where N is a positive integer. On the other hand, the phase compensation circuit 27 has a positive electrical length $\theta 7$ that allows the total electrical length of a signal transmission path starting from the output source 22a of the auxiliary amplifying element 22 to the power combiner 31 to become 180°×M−180° where M is a positive integer.

For example, assume a case where the electrical length $\theta 1$ of the parasitic element 13 is 20°, the electrical length $\theta 4$ of the parasitic element 23 is 20°, the electrical length $\theta 2$ of the matching circuit 15 is 80°, and the electrical length $\theta 5$ of the matching circuit 25 is 80°. In this case, in order to satisfy the condition that the total electrical length of the signal transmission path starting from the output source 12a of the main amplifying element 12 to the power combiner 31 is 180°× N−90°, the phase compensation circuit 16 needs to have a negative electrical length $\theta 3$ of −10°, for example. On the other hand, in order to satisfy the condition that the total electrical length of the signal transmission path starting from the output source 22a of the auxiliary amplifying element 22 to the power combiner 31 is 180°×M−180°, the phase compensation circuit 27 may have a positive electrical length $\theta 7$ of 80°, for example.

In the Doherty amplifier 1A of the second embodiment as well, similarly to the case of the first embodiment, the phase compensation circuit 16 has a negative electrical length θ3 that allows the total electrical length of a signal transmission path starting from the output source 12a of the main amplifying element 12 to the power combiner 31 to become 180°×N−90° where N is a positive integer, which makes it possible to shorten the total electrical length of the signal transmission path. Thus, even in a case where the parasitic element 13 of the carrier amplifier 11 is an unnecessary parasitic element that changes the phase of an amplified output from the main amplifying element 12 as well, the Doherty amplifier 1A can amplify power of wideband signals with high efficiency. Furthermore, even in a case where the matching circuit 15 has a configuration that unnecessarily changes the phase of an amplified output from the main amplifying element 12, the phase compensation circuit 16 can compensate for the unnecessary phase change, which enables the Doherty amplifier 1A to amplify power of wideband signals with high efficiency.

Third Embodiment

Figure 7:
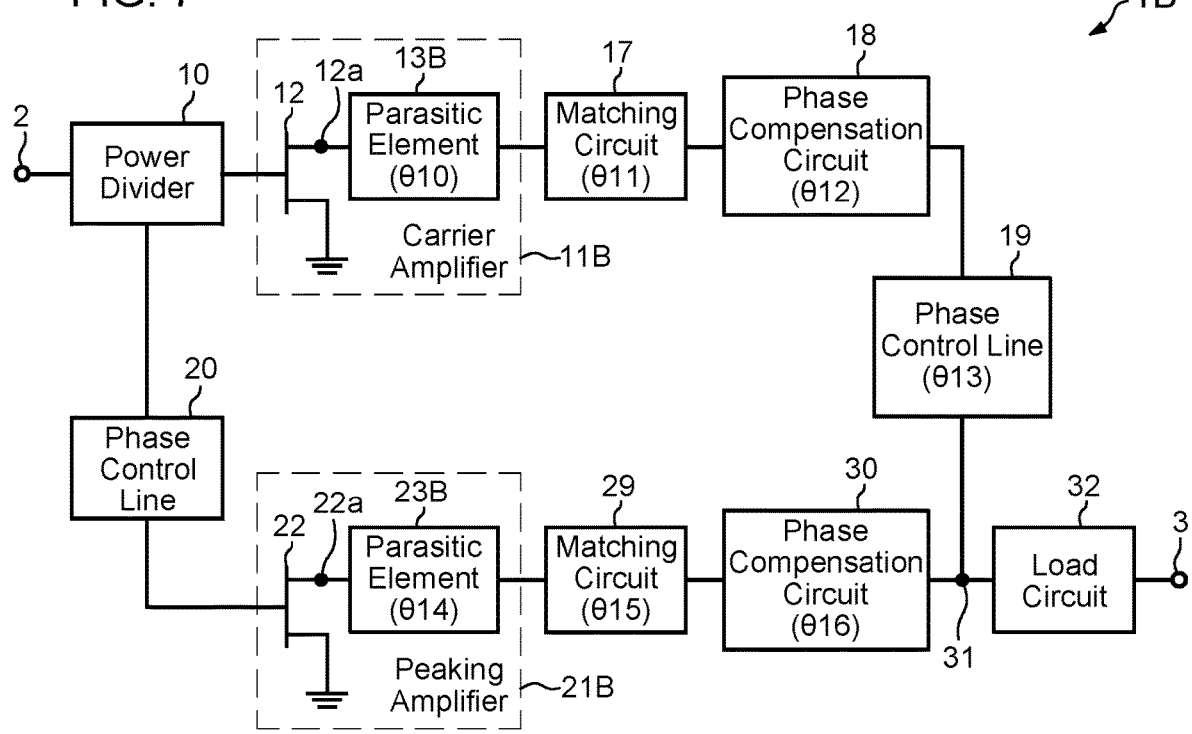
FIG. 7 is a diagram schematically illustrating a configuration of a Doherty amplifier according to a third embodiment of the present invention.

Next, a third embodiment according to the present invention will be described. FIG. 7 is a diagram illustrating a schematic configuration of a Doherty amplifier 1B according to the third embodiment of the present invention. The Doherty amplifier 1B includes an input terminal 2, a power divider 10, a phase control line 20, a power combiner 31, a load circuit 32, and an output terminal 3, similarly to the first embodiment.

The Doherty amplifier 1B of the present embodiment includes a carrier amplifier 11B for amplifying power of one input signal (first input signal) output from the power divider 10, a matching circuit (first matching circuit) 17 connected to an output end of the carrier amplifier 11B, a phase compensation circuit (first phase compensation circuit) 18 for adjusting the phase of a signal transferred from the output end of the carrier amplifier 11B via the matching circuit 17, and a phase control line 19 that is located between an output end of the phase compensation circuit 18 and the power combiner 31 and performs phase adjustment. Furthermore, the Doherty amplifier 1B includes a peaking amplifier 21B for amplifying the power of a signal output from the phase control line 20, a matching circuit (second matching circuit) 29 connected to an input end of the peaking amplifier 21B, and a phase compensation circuit (second phase compensation circuit) 30 for adjusting the phase of a signal input from an output end of the peaking amplifier 21B via the matching circuit 29.

The carrier amplifier 11B includes a main amplifying element 12, and a parasitic element 13B connected to an output source 12a that is a current source of the main amplifying element 12. The parasitic element 13B has a positive electrical length θ10 that changes the phase of a signal output from the main amplifying element 12. On the other hand, the peaking amplifier 21B includes an auxiliary amplifying element 22, and a parasitic element 23B connected to an output source 22a that is a current source of the auxiliary amplifying element 22. The parasitic element 23B has a positive electrical length θ14 that changes the phase of a signal output from the auxiliary amplifying element 22. Each of the parasitic elements 13B and 23B is made of an element, a wire, or a package material (such as ceramics or resin), which has a parasitic capacitance, for example, similarly to the parasitic elements 13 and 23 of the first embodiment.

The matching circuit 17 is a circuit that is located between an output end of the carrier amplifier 11B and an input end of the phase compensation circuit 18 and performs impedance matching. In addition, the matching circuit 29 is a circuit that is located between an output end of the peaking amplifier 21B and an input end of the phase compensation circuit 30 and performs impedance matching. Each of the matching circuits 17 and 29, the phase compensation circuits 18 and 30, and the phase control line 19 may be comprised of either a lumped constant circuit including an element such as a chip capacitor, or a distributed constant circuit element such as a line pattern. Similarly to the case of the first embodiment, the matching circuits 17 and 29 have positive electrical lengths θ11 and θ15, respectively. In contrast, the phase compensation circuits 18 and 30 have negative electrical lengths θ12 and θ16, respectively. The phase compensation circuits 18 and 30 can be configured as phase advancers similarly to the phase compensation circuits 16 and 26 of the first embodiment, for example. In addition, the phase control line 19 has a positive electrical length θ13.

In the present embodiment, the phase compensation circuit 18 has a negative electrical length θ12 that allows the total electrical length of a signal transmission path starting from the output source 12a of the main amplifying element 12 to the power combiner 31 to become 180°×N−90° where N is a positive integer. On the other hand, the phase compensation circuit 30 has a negative electrical length θ16 that allows the total electrical length of a signal transmission path starting from the output source 22a of the auxiliary amplifying element 22 to the power combiner 31 to become 180°×M−180° where M is a positive integer.

For example, assume a case where the electrical length θ10 of the parasitic element 13B is 100°, the electrical length θ14 of the parasitic element 23B is 100°, the electrical length θ11 of the matching circuit 17 is 100°, the electrical length θ15 of the matching circuit 29 is 100°, and the electrical length θ13 of the phase control line 19 is 90°. In order to satisfy the condition that the total electrical length of the signal transmission path starting from the output source 12a of the main amplifying element 12 to the power combiner 31 is 180°×N−90°, the phase compensation circuit 18 may have a negative electrical length θ12 of −20°, for example. Similarly, in order to satisfy the condition that the total electrical length of the signal transmission path starting from the output source 22a of the auxiliary amplifying element 22 to the power combiner 31 is 180°×M−180°, the phase compensation circuit 30 may have a negative electrical length θ16 of −20°, for example.

As described above, in the Doherty amplifier 1B of the third embodiment as well, the phase compensation circuit 18 has a negative electrical length θ12 that allows the total electrical length of a signal transmission path starting from the output source 12a of the main amplifying element 12 to the power combiner 31 to become 180°×N−90° where N is a positive integer, which makes it possible to shorten the total electrical length of the signal transmission path. In addition, the phase compensation circuit 30 also has a negative electrical length θ16 that allows the total electrical length of the signal transmission path starting from the output source 22a of the auxiliary amplifying element 22 to the power combiner 31 to become 180°×M−180° where M is a positive integer, which makes it possible to shorten the total electrical length of the signal transmission path. Thus, even in a case where the phase control line 19 is provided between the phase compensation circuit 18 and the power combiner 31, the Doherty amplifier 1B can amplify power of wideband signals with high efficiency, similarly to the case of the first embodiment.

Various embodiments according to the present invention have been described above with reference to the drawings. Those embodiments, however, are examples of the present invention, and various embodiments other than those embodiments may also be adopted. For example, while each of the Doherty amplifiers 1, 1A, and 1B of the first to third embodiments has a configuration including the input terminal 2, the power divider 10, and the phase control line 20, no limitation thereto is intended. The configurations of the Doherty amplifiers 1, 1A, and 1B may be changed as appropriate to include a first input terminal for supplying a high-frequency signal (first input signal) input from a first signal generator (not illustrated) to the carrier amplifier 11 or 11B and a second input terminal for supplying a high-frequency signal (second input signal) input from a second signal generator (not illustrated) to the peaking amplifier 21 or 21B, instead of the input terminal 2, the power divider 10, and the phase control line 20.

Note that the first to third embodiments can be freely combined, any components in the embodiments can be modified, and any components in the embodiments can be omitted within the scope of the present invention.

INDUSTRIAL APPLICABILITY

A Doherty amplifier according to the present invention is capable of amplifying the power of high-frequency signals such as microwaves or millimeter waves, and thus is suitable for use in radio communication technologies such as mobile communication and satellite communication, and broadcasting technologies such as terrestrial digital broadcasting and satellite broadcasting, for example.

REFERENCE SIGNS LIST 1, 1A, 1B: Doherty amplifier; 2: input terminal; 3: output terminal; 10: power divider; 11, 11B: carrier amplifiers; 12: main amplifying element; 12a: output source; 13, 13B: parasitic elements; 15, 17, 25, 29: matching circuits; 16, 16A, 16B, 16C, 18, 26, 26A, 26B, 26C, 27, 30: phase compensation circuits; 19, 20: phase control lines; 21, 21B: peaking amplifiers; 22: auxiliary amplifying element; 22a: output source; 23, 23B: parasitic elements; 31: power combiner; 32: load circuit; 41, 42: capacitive elements; 43, 44, 45: inductor elements; 51, 52: capacitive elements; and 53, 54, 55: inductor elements.

The invention claimed is:

1. A Doherty amplifier comprising:
a power divider configured to divide a high-frequency signal into a first input signal and a second input signal;
a carrier amplifier including a main amplifying element configured to amplify power of the first input signal and including a parasitic element connected to an output source of the main amplifying element;
a first phase compensation circuit having a negative electrical length, configured to adjust a phase of an output signal of the carrier amplifier;
a peaking amplifier including an auxiliary amplifying element configured to amplify power of the second input signal and including a parasitic element connected to an output source of the auxiliary amplifying element;
a second phase compensation circuit configured to adjust a phase of an output signal of the peaking amplifier; and
a power combiner configured to combine an output of the first phase compensation circuit with an output of the second phase compensation circuit, wherein
a signal transmission path starting from the output source of the main amplifying element to the power combiner has an electrical length of $180°\times N-90°$ where N is a positive integer, and
a signal transmission path starting from the output source of the auxiliary amplifying element to the power combiner has an electrical length of $180°\times M-180°$ where M is a positive integer.

2. The Doherty amplifier according to claim 1, wherein the second phase compensation circuit has a negative electrical length.

3. The Doherty amplifier according to claim 1, further comprising:
a first matching circuit located between an output end of the carrier amplifier and an input end of the first phase compensation circuit, to perform impedance matching; and
a second matching circuit located between an output end of the peaking amplifier and an input end of the second phase compensation circuit, to perform impedance matching.

4. The Doherty amplifier according to claim 2, further comprising a phase control line located between an output end of the first phase compensation circuit and the power combiner.

5. The Doherty amplifier according to claim 1, wherein the first phase compensation circuit includes a phase advancer configured to advance a phase of an output signal of the carrier amplifier.

6. The Doherty amplifier according to claim 2, wherein the second phase compensation circuit includes a phase advancer configured to advance a phase of an output signal of the peaking amplifier.

7. A Doherty amplifier comprising:
a power divider configured to divide a high-frequency signal into a first input signal and a second input signal;
a carrier amplifier including a main amplifying element configured to amplify power of the first input signal and including a parasitic element connected to an output source of the main amplifying element;
a first phase compensation circuit configured to adjust a phase of an output signal of the carrier amplifier;
a peaking amplifier including an auxiliary amplifying element configured to amplify power of the second input signal and including a parasitic element connected to an output source of the auxiliary amplifying element;
a second phase compensation circuit having a negative electrical length, configured to adjust a phase of an output signal of the peaking amplifier; and
a power combiner configured to combine an output of the first phase compensation circuit with an output of the second phase compensation circuit, wherein
a signal transmission path starting from the output source of the main amplifying element to the power combiner has an electrical length of $180°\times N-90°$ where N is a positive integer, and
an electrical length of a signal transmission path starting from the output source of the auxiliary amplifying element to the power combiner has an electrical length of $180°\times M-180°$ where M is a positive integer.

8. The Doherty amplifier according to claim 7, further comprising:

a first matching circuit located between an output end of the carrier amplifier and an input end of the first phase compensation circuit, to perform impedance matching; and a second matching circuit located between an output end of the peaking amplifier and an input end of the second phase compensation circuit, to perform impedance matching.

9. The Doherty amplifier according to claim 7, wherein the second phase compensation circuit includes a phase advancer configured to advance a phase of an output signal of the peaking amplifier.

\* \* \* \* \*